(12) United States Patent
Hung et al.

(10) Patent No.: US 11,749,742 B2
(45) Date of Patent: Sep. 5, 2023

(54) SELF-ALIGNED INNER SPACER ON GATE-ALL-AROUND STRUCTURE AND METHODS OF FORMING THE SAME

(71) Applicant: Taiwan Semiconductor Manufacturing Co., Ltd., Hsinchu (TW)

(72) Inventors: Tsungyu Hung, Hsinchu (TW); Pang-Yen Tsai, Hsin-Chu Hsian (TW); Pei-Wei Lee, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 194 days.

(21) Appl. No.: 17/182,651

(22) Filed: Feb. 23, 2021

(65) Prior Publication Data

US 2021/0175345 A1    Jun. 10, 2021

Related U.S. Application Data

(62) Division of application No. 16/439,909, filed on Jun. 13, 2019, now Pat. No. 10,930,755.

(Continued)

(51) Int. Cl.
*H01L 29/66* (2006.01)
*H01L 21/02* (2006.01)
(Continued)

(52) U.S. Cl.
CPC .... *H01L 29/66553* (2013.01); *H01L 21/0217* (2013.01); *H01L 21/02247* (2013.01);
(Continued)

(58) Field of Classification Search
CPC .......... H01L 29/66553; H01L 21/0217; H01L 21/02247; H01L 21/02252;
(Continued)

(56) References Cited

U.S. PATENT DOCUMENTS 10,008,583 B1* 6/2018 Rodder ............... H01L 29/1033
10,516,051 B2* 12/2019 Ching .................. H01L 29/785
(Continued)

*Primary Examiner* — Yasser A Abdelaziez
(74) *Attorney, Agent, or Firm* — HAYNES AND BOONE, LLP

(57) ABSTRACT

Semiconductor device and the manufacturing method thereof are disclosed herein. An exemplary method of forming a semiconductor device comprises forming a fin over a substrate, wherein the fin comprises a first semiconductor layer and a second semiconductor layer comprising different semiconductor materials, and the fin includes a channel region and a source/drain region; forming a dummy gate structure over the substrate and the fin; etching a portion of the fin in the source/drain region; selectively removing an edge portion of the second semiconductor layer in the channel region of the fin such that the second semiconductor layer is recessed, and an edge portion of the first semiconductor layer is suspended; performing a reflow process to the first semiconductor layer to form an inner spacer, wherein the inner spacer forms sidewall surfaces of the source/drain region of the fin; and epitaxially growing a sour/drain feature in the source/drain region.

20 Claims, 13 Drawing Sheets

Related U.S. Application Data

(60) Provisional application No. 62/771,334, filed on Nov. 26, 2018.

(51) Int. Cl.
  *H01L 27/088* (2006.01)
  *H01L 29/78* (2006.01)
  *H01L 29/06* (2006.01)
  *H01L 21/306* (2006.01)
  *H01L 29/423* (2006.01)

(52) U.S. Cl.
  CPC .. *H01L 21/02252* (2013.01); *H01L 21/02255* (2013.01); *H01L 27/0886* (2013.01); *H01L 29/0653* (2013.01); *H01L 29/6681* (2013.01); *H01L 29/66545* (2013.01); *H01L 29/7853* (2013.01); *H01L 21/30604* (2013.01); *H01L 29/0673* (2013.01); *H01L 29/42392* (2013.01)

(58) Field of Classification Search
  CPC ........... H01L 21/02255; H01L 27/0886; H01L 29/0653; H01L 29/66545; H01L 29/6681; H01L 29/7853; H01L 21/30604; H01L 29/0673; H01L 29/165; H01L 29/267; H01L 29/6656; H01L 29/66439; H01L 29/775; H01L 29/78696; H01L 29/66795; H01L 29/7848; H01L 29/785
  See application file for complete search history.

(56) References Cited

U.S. PATENT DOCUMENTS

| | | |
|---|---|---|
| 2017/0288018 A1* | 10/2017 | Tung ................... H01L 29/0673 |
| 2018/0254329 A1 | 9/2018 | Guillorn et al. |
| 2018/0331232 A1 | 11/2018 | Frougier et al. |
| 2020/0006478 A1 | 1/2020 | Hsu et al. |
| 2020/0044023 A1 | 2/2020 | Reznicek et al. |
| 2020/0044045 A1* | 2/2020 | Wang ................ H01L 29/66439 |
| 2020/0168722 A1 | 5/2020 | Hung et al. |

* cited by examiner

SELF-ALIGNED INNER SPACER ON GATE-ALL-AROUND STRUCTURE AND METHODS OF FORMING THE SAME

PRIORITY DATA

The present application is a divisional application of U.S. patent application Ser. No. 16/439,909, filed Jun. 13, 2019, which claims benefit of U.S. Provisional Patent Application No. 62/771,334, filed Nov. 26, 2018, each of which is incorporated herein by reference in its entirety.

BACKGROUND

Multi-gate devices have been introduced to improve gate control by increasing gate-channel coupling, reducing off-state current, and reducing short-channel effects (SCEs). One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes, allowing aggressive scaling down of transistors while maintaining gate control and mitigating SCEs. However, fabrication of GAA transistors presents challenges. For example, poor epitaxial source and drain (S/D) growth has been observed in GAA devices. Epitaxial S/D features may experience defects caused by roughness of the surface that the S/D feature is grown on, which may cause mobility reduction of the GAA device and thus degrade the GAA device's performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
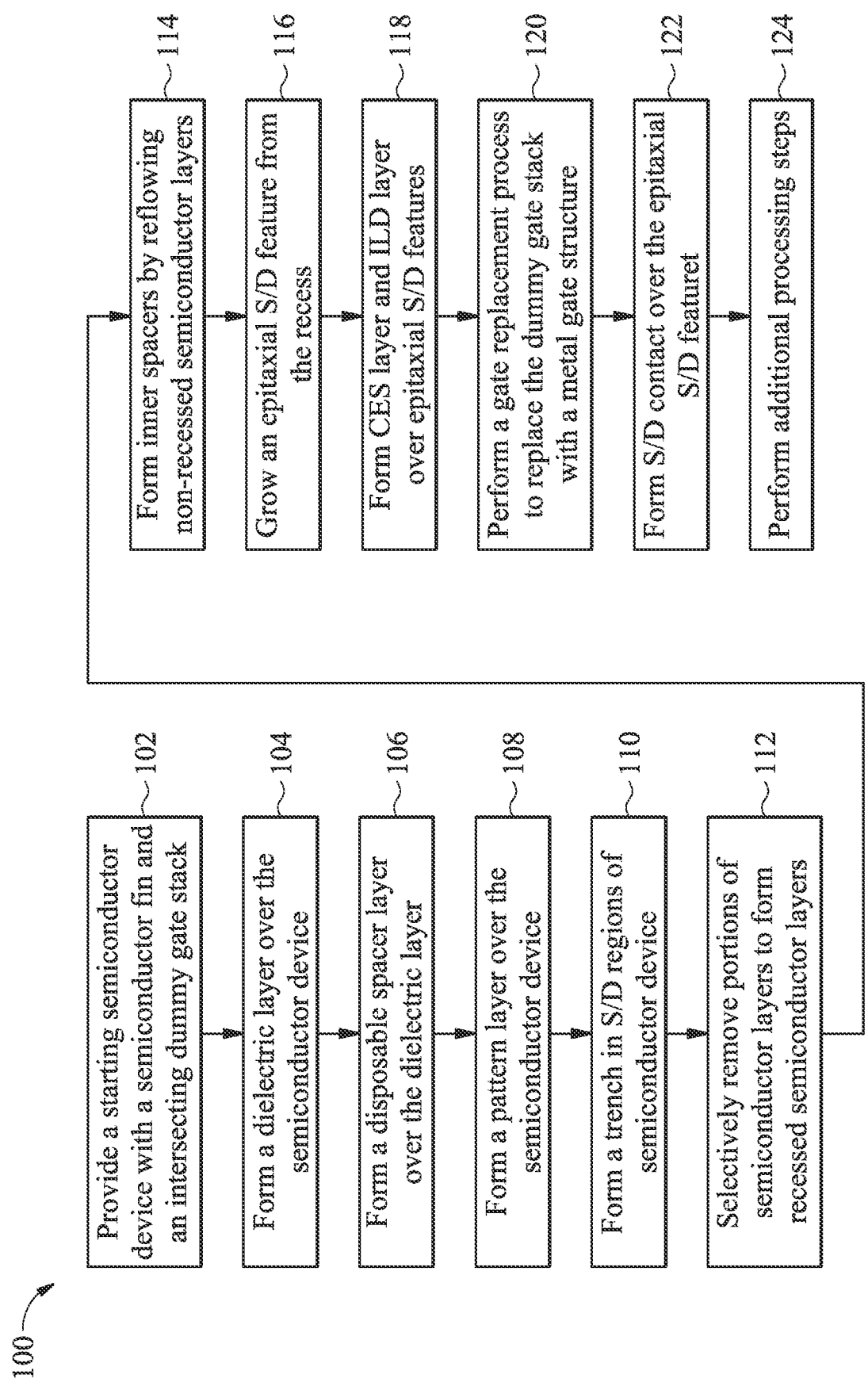
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs), and/or other FETs.

For advanced integrated circuit (IC) technology nodes, GAA devices have become a popular candidate for high performance and low leakage applications since they allow more aggressive gate length scaling for both performance and density improvement than Fin-like Field-Effect-Transistor (FinFET) device. The channel region of a GAA device may be formed from nanowires, nanosheets, and/or other nanostructures. The present disclosure is generally related to formation of inner spacers in a GAA device. Inner spacers may include semiconductor portions in the channel region disposed between the nanostructures and the Source/Drain (S/D) features. The present disclosure provides inner spacers that are formed by reflowing semiconductor layers (for example, Si layers) that are used to form the nanostructures. The reflow process may provide a smooth S/D region interface, which in turn may improve the epitaxial growth of the S/D features and reduce interface defects. Of course, these advantages are merely examples, and no particular advantage is required for any particular embodiment.

Figure 2A:
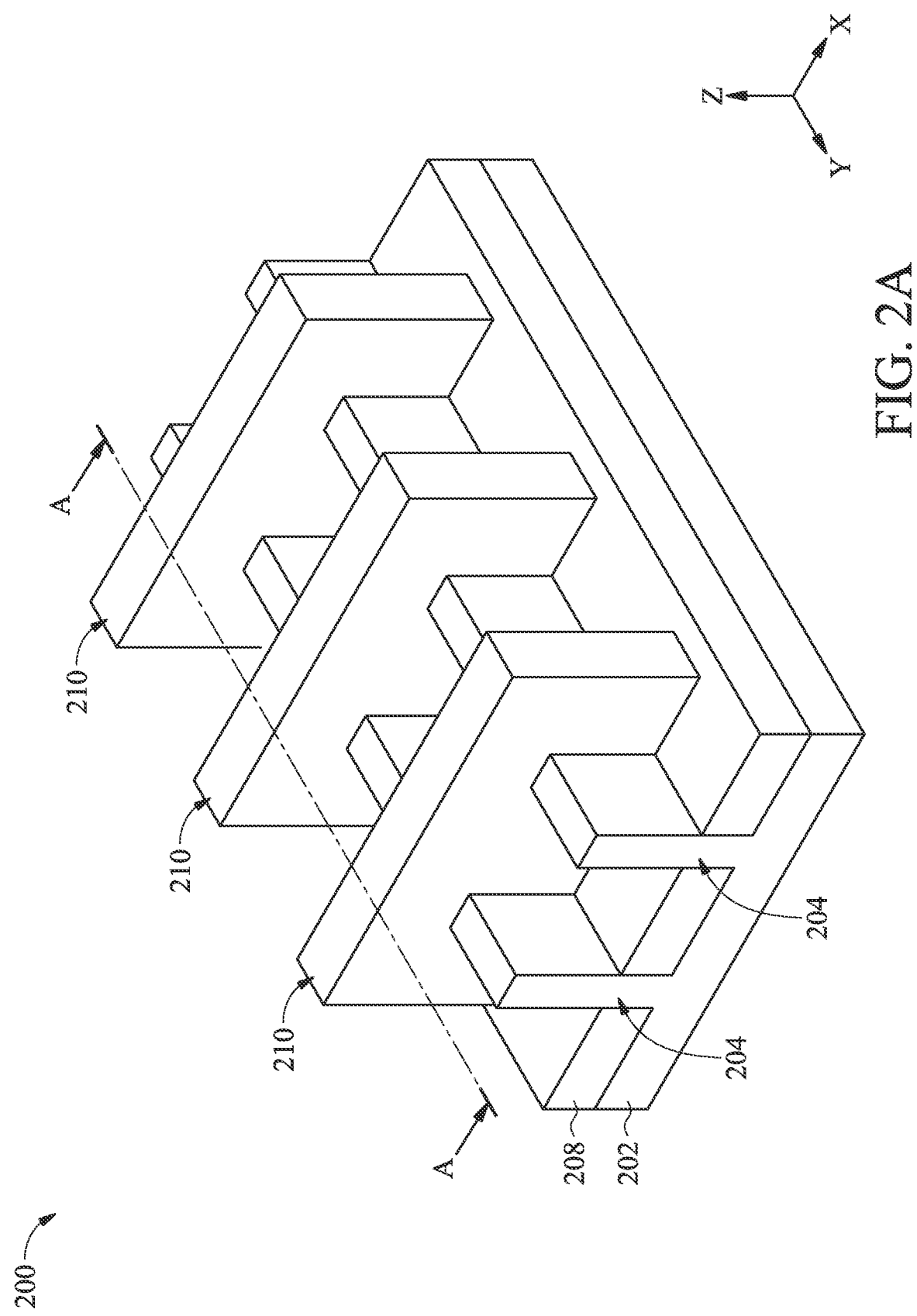
FIG. 2A illustrates a three-dimensional perspective view of an example semiconductor device in accordance with some embodiments of the present disclosure.
Figure 2B:
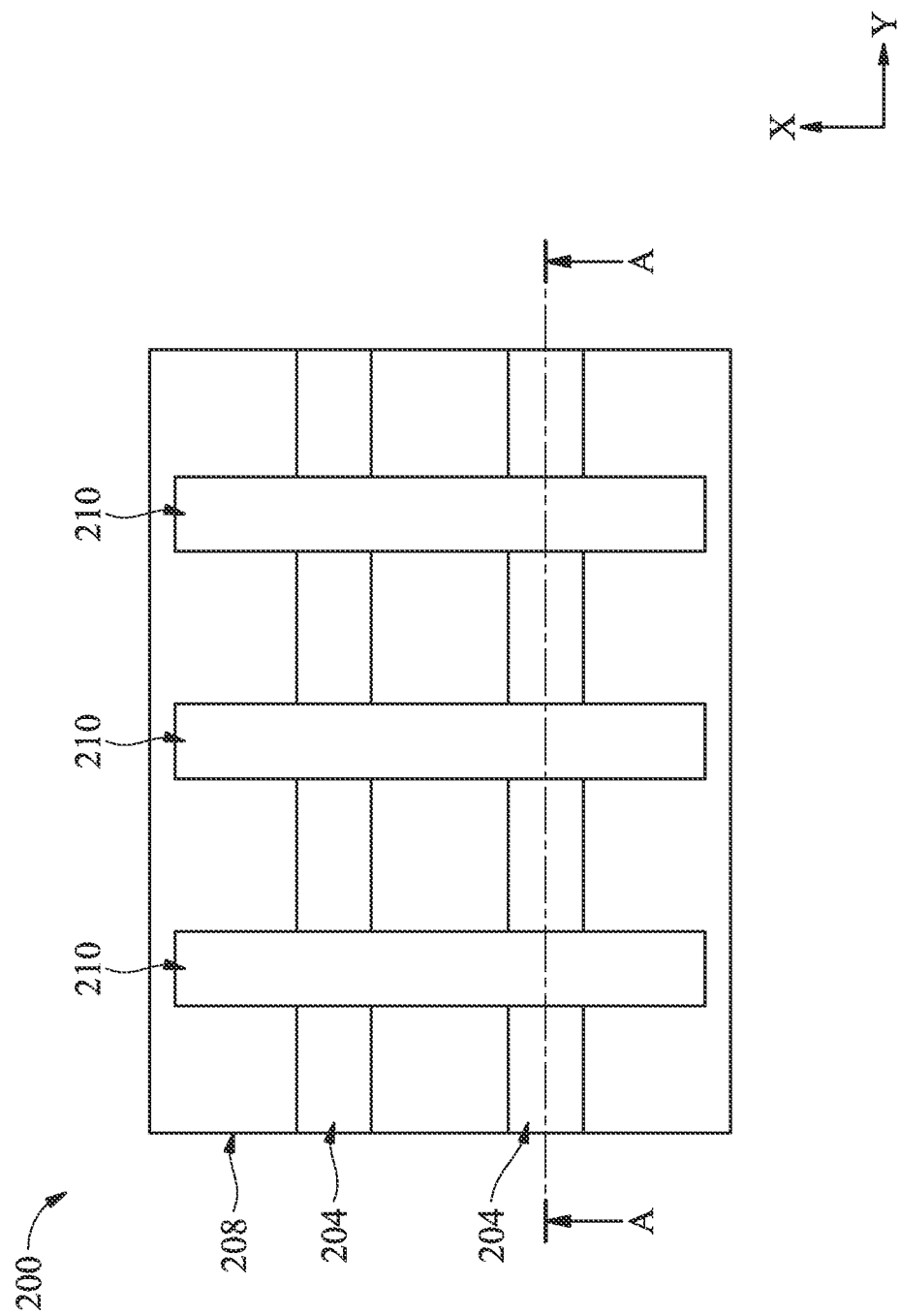
FIG. 2B illustrates a planar top view of an example semiconductor device in accordance with some embodiments of the present disclosure.
Figure 3:
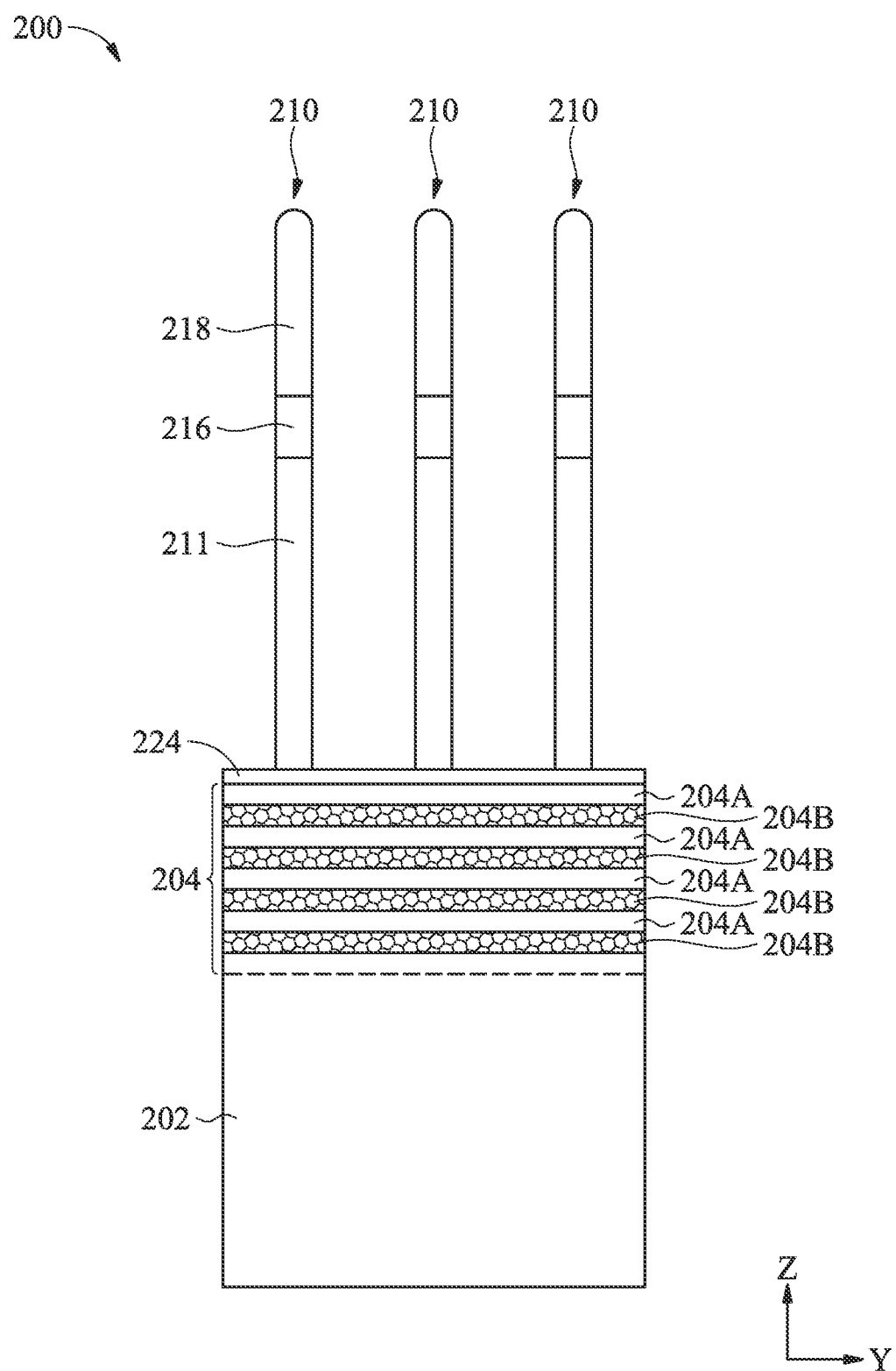
FIGS. 3-12 illustrate cross-sectional views of the semiconductor device of FIGS. 2A and 2B taken along line AA' at intermediate stages of an embodiment of the method of FIG. 2 in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2A illustrates a three-dimensional view of device 200. FIG. 2B illustrates a planar top view of device 200. FIGS. 3-12 illustrate cross-sectional views of device 200 taken along the length of a fin as indicated by plane AA' shown in FIGS. 2A and 2B (that is, along a y-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET or a GAA FET), the present disclosure may also provide embodiments for fabricating planar FET devices.

Referring to FIGS. 1 and 2A-2B, at operation 102, method 100 provides a semiconductor device 200 that includes one or more semiconductor fins 204 protruding from a substrate 202 and separated by isolation structures 208 and one or more dummy gate stacks 210 disposed over substrate 202. Device 200 may include other components, such as gate spacers disposed on sidewalls of dummy gate stacks 210, various hard mask layers disposed over the dummy gate stack 210, barrier layers, other suitable layers, or combinations thereof.

In the depicted embodiment of FIGS. 2A and 2B, device 200 comprises a substrate (wafer) 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}P$), arsenic, other n-type dopant, or combinations thereof. In the depicted embodiment, substrate 202 includes p-type doped region (for example, p-type wells) doped with p-type dopants, such as boron (for example, $^{11}B$, BF2), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Device 200 includes semiconductor fins 204 and the lower portions of semiconductor fins 204 (FIG. 2A) are separated by an isolation structure 208. Isolation structure 208 electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. Isolation structure 208 includes an isolation material, such as silicon oxide, silicon nitride, silicon oxynitride, other suitable isolation material (for example, including silicon, oxygen, nitrogen, carbon, and/or other suitable isolation constituent), or combinations thereof.

Each semiconductor fin 204 may be suitable for providing an n-type FET or a p-type FET. In some embodiments, semiconductor fins 204 as illustrated herein may be suitable for providing FETs of a similar type, i.e., both n-type or both p-type. Alternatively, they may be suitable for providing FETs of opposite types, i.e., an n-type and a p-type. Semiconductor fins 204 are oriented substantially parallel to one another. Semiconductor fins 204 each have a width defined in an x-direction, a length defined in a y-direction, and a height defined in a z-direction. Furthermore, each of semiconductor fins 204 has at least one channel region and at least one source region and drain region defined along their length in the y-direction, where the at least one channel region is covered by dummy gate stacks 210 and is disposed between the source region and the drain region.

In some embodiments, semiconductor fins 204 includes a semiconductor layer stack having various semiconductor layers (such as a heterostructure) disposed over substrate 202. In the depicted embodiments of FIGS. 3-12, the semiconductor layer stack includes alternating semiconductor layers, such as semiconductor layers 204A composed of a first semiconductor material and semiconductor layers 204B composed of a second semiconductor material which is different from the first semiconductor material. The different semiconductor materials composed in alternating semiconductor layers 204A and 204B are provided for different oxidation rates and/or different etch selectivity. In some examples, semiconductor layers 204A comprise silicon (Si), and semiconductor layers 204B comprise silicon germanium (SiGe). Thus the exemplary semiconductor layer stack is arranged with alternating Si/SiGe/Si/SiGe . . . layers from bottom to top. As shown in the depicted embodiments of FIGS. 3 to 12, the bottom semiconductor layer 204A may include a portion of the substrate 202 (which comprises Si in some of the depicted embodiments). In some embodiments, the material of the top semiconductor layer in the semiconductor layer stack is the same as the bottom semiconductor layer. In some other embodiments, the material of the top semiconductor layer is different from the bottom semiconductor layer. In some examples, in a semiconductor layer stack alternating Si and SiGe layers, the bottom semiconductor layer comprises Si, the top semiconductor layer may be the Si or SiGe layer.

In some embodiments, the semiconductor layer stack includes semiconductor layers of the same material but with alternating constituent atomic percentages, such as semiconductor layers having a constituent of a first atomic percent and semiconductor layers having the constituent of a second atomic percent. In some examples, the semiconductor layer stack includes silicon germanium layers having alternating silicon and/or germanium atomic percentages (for example, $Si_aGe_b/Si_cGe_d/Si_aGe_b/Si_cGe_d$ from bottom to top, where a and c are different atomic percentages of silicon and b and d are different atomic percentages of germanium).

In various embodiments, the alternating material layers in the semiconductor layer stack may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the alternating semiconductor layers may be chosen based on providing differing oxidation rates and/or etch selectivity.

In some other embodiments, semiconductor layers 204A may be undoped or substantially dopant-free (i.e., having an extrinsic dopant concentration from about 0 cm$^{-3}$ to about 1×10$^{17}$ cm$^{-3}$). In some examples, no doping is performed when forming semiconductor layers 204A. In some other embodiments, semiconductor layers 204A may be doped with a p-type dopant such as boron or boron compound (B, $^{11}$B or BF2), aluminum (Al), indium (In), gallium (Ga), or combinations thereof for a p-type channel, or an n-type dopant such as phosphorus (P, $^{31}$P), arsenic (As), antimony (Sb), or combinations thereof for an n-type channel. In some examples, semiconductor layers 204B may include SiGe with more than 25% Ge in molar ratio. In some examples, semiconductor layers 204B may comprise SiGe with about 25% to 50% of Ge in molar ratio. In some embodiments, semiconductor layers 204A may include different compositions among them, and semiconductor layers 204B may include different compositions among them.

In some embodiments, different semiconductor layers in the semiconductor layer stack have the same thickness. In some other embodiments, different semiconductor layers in the semiconductor layer stack have different thickness. In some examples, the bottom layer of the semiconductor layer stack (which is partially buried in isolation structure 208) is thicker than other layers of the semiconductor layer stack. In some embodiments, each semiconductor layer that extends above isolation structure 208 has a thickness ranging from about 5 nm to about 20 nm. A number of the alternating semiconductor layers depends on design of semiconductor device 200. In some examples, semiconductor fins 204 may comprise three to ten alternating semiconductor layers. In some embodiments, a total combined height of the semiconductor fins 204 (semiconductor layer stacks) in the z-direction is between about 50 nm and about 70 nm.

Semiconductor fins 204, including alternating semiconductor layers 204A and 204B, are formed over substrate 202 using any suitable process. In some embodiments, a combination of deposition, epitaxy, photolithography, etching, and/or other suitable processes are performed to form semiconductor fins 204 as illustrated in FIGS. 3-12. Isolation structure 208 and semiconductor fins 204 may be formed in different orders. In some embodiments, isolation structure 208 is formed before semiconductor fins 204 (an isolation-first scheme). In some other embodiments, semiconductor fins 204 are formed before isolation structure 208 (a fin-first scheme). These two embodiments are further discussed below by way of examples.

In an isolation-first scheme, a masking element is formed over substrate 202 through a photolithography process. The photolithography process may include forming a photoresist (or resist) over substrate 202, exposing the resist to a pattern that defines various geometrical shapes, performing post-exposure bake processes, and developing the resist to form the masking element. Then, substrate 202 is etched through the masking element to form first trenches therein. The etching processes may include one or more dry etching processes, wet etching processes, and other suitable etching techniques. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO3), and/or acetic acid (CH3COOH); or other suitable wet etchant. Subsequently, the first trenches are filled with a dielectric material, such as silicon oxide and/or silicon nitride, and performs a chemical mechanical planarization (CMP) process to planarize top surfaces of the dielectric material and substrate 202. The dielectric material may be formed by chemical vapor deposition (CVD), plasma enhanced CVD (PECVD), physical vapor deposition (PVD), thermal oxidation, or other techniques. This layer of dielectric material is referred to as dielectric layer which isolates various portions of substrate 202. Next, substrate 202 is etched while dielectric layer remains substantially unchanged through a selective etching process, thereby forming second trenches between various portions of dielectric layer. The second trenches are etched to a desired depth for growing fins 204 therein. The etching process may be a dry etching process, a wet etching process, or another suitable etching technique. Subsequently, various semiconductor layers comprising different semiconductor materials are alternately deposited in the second trenches. For example, the semiconductor layers may be grown by a molecular beam epitaxy (MBE) process, a chemical vapor deposition (CVD) process such as a metal organic CVD (MOCVD) process, and/or other suitable epitaxial growth processes. In some embodiments, a first type of the deposited layers, such as semiconductor layers 204A, include the same material (for example, Si) as substrate 202. In some other embodiments, all deposited layers (including both semiconductor layers 204A and 204B) include different materials from substrate 202. A chemical mechanical planarization (CMP) process may be performed to planarize a top surface of device 200. Subsequently, dielectric layer is recessed to provide semiconductor fins 204 extending above a top surface of dielectric layer. In some embodiments, a recessing depth is controlled (e.g., by controlling an etching time) so as to obtain a desired height (for example, 50-70 nm) of the exposed upper portion of semiconductor fins 204. The remaining portions of dielectric layer become isolation structure 208.

A fin-first scheme may include substantially the same or similar processes as discussed above, albeit in different orders. In some examples, first, various semiconductor layers comprising different semiconductor materials are alternatively deposited over substrate 202. A masking element is formed over the semiconductor layers through a photolithography process. The semiconductor layers are then etched through the masking element to form trenches therein. The remaining portions of the semiconductor layers become semiconductor fins 204. Subsequently, a dielectric material, such as silicon oxide, is deposited into the trenches. A chemical mechanical planarization (CMP) process may be performed to planarize a top surface of device 200. Thereafter, the dielectric material is recessed to form isolation structure 208.

In the depicted embodiment of FIGS. 2A and 2B, various dummy gate stacks 210 are formed over semiconductor fins 204. Each dummy gate stack 210 serves as a placeholder for subsequently forming a metal gate structure. As will be discussed in detail below, portions of dummy gate stacks 210 are replaced with metal gate structures during a gate replacement process after other components (for example, epitaxial S/D features 250) of semiconductor device 200 are fabricated. Dummy gate stacks 210 extend along the x-direction and traverse respective semiconductor fins 204. In the depicted embodiment, dummy gate stacks 210 are disposed over channel regions of semiconductor fins 204, thereby interposing respective S/D regions of semiconductor fins 204. Dummy gate stacks 210 engage the respective channel regions of semiconductor fins 204, such that current can flow between the respective S/D regions of semiconductor fins 204 during operation. In the depicted embodiment of FIG. 3, each dummy gate stack 210 includes a dummy gate electrode 211 comprising polysilicon (or poly) and various other layers, for example, a first hard mask layer 216 disposed over dummy gate electrode 211, and/or a second hard mask layer 218 disposed over first hard mask layer 216. Dummy gate stacks 210 may also include an interfacial layer 224 disposed over semiconductor fins 204 and substrate 202, and below dummy gate electrodes 211. First and second hard mask layers 216 and 218 may each include any suitable dielectric material, such as a semiconductor oxide and/or a semiconductor nitride. In some embodiments, hard mask layer 216 includes silicon carbonitride (SiCN) or silicon nitride (SiN), and hard mask layer 218 includes silicon oxide ($SiO_2$). Interfacial layer 224 may include any suitable material, for example, silicon oxide. Dummy gate electrode 211 can be single dielectric layer of multiple layers. A material of dummy gate electrode 211 can be selected from silicon oxide ($SiO_2$), silicon oxide carbide (SiOC), silicon oxide nitride (SiON), silicon carboxynitride (SiOCN), carbon content oxide, nitrogen content oxide, carbon and nitrogen content oxide, metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), any other suitable material, or combinations thereof.

Dummy gate stacks 210 are formed by deposition processes, lithography processes, etching processes, other suitable processes, or combinations thereof. In some examples, a deposition process is performed to form a dummy gate electrode layer 211, a first hard mask layer 216, and a second hard mask layer 218 over substrate 202, semiconductor fins 204, and isolation structure 208. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern dummy gate electrode layer 211, first hard mask layer 216, and second hard mask layer 218 to form dummy gate stacks 210, such that dummy gate stacks 210 wrap semiconductor fins 204. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Figure 4:
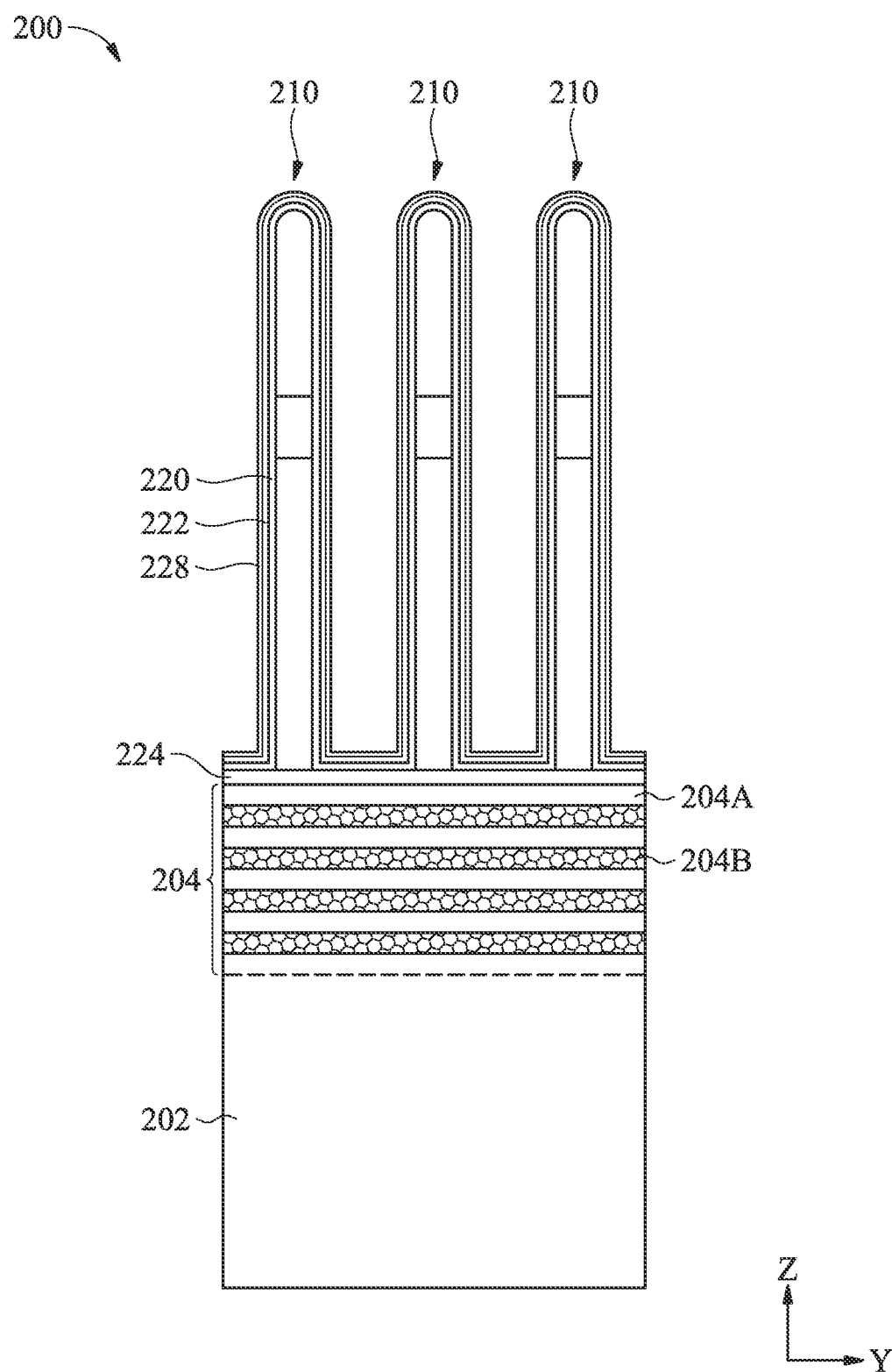

Now referring to FIGS. 1 and 4, at operation 104, method 100 forms a dielectric layer 220 over semiconductor device 200. In many embodiments, dielectric layer 220 is formed conformally over semiconductor device 200, including semiconductor fins 204 and dummy gate stacks 210. Dielectric layer 220 may include any suitable dielectric material, such as a nitrogen-containing dielectric material, and may be formed by any suitable method, such as ALD, CVD, PVD, other suitable methods, or combinations thereof. In the depicted embodiment, dielectric layer 220 is formed by a thermal ALD process. In some examples, the dielectric layer 220 may include silicon nitride (SiN), silicon carbonitride (SiCN), silicon oxycarbonitride (SiOCN), other suitable dielectric materials, or combinations thereof.

Still referring to FIGS. 1 and 4, at operation 106, method 100 forms a disposable spacer layer 222 over dielectric layer 220. Similar to dielectric layer 220, disposable spacer layer 222 may be formed conformally over dummy gate stacks 210, that is, having about the same thickness on top surfaces and sidewalls of dielectric layer 220. Disposable spacer layer 222 may include any suitable dielectric material, for example, silicon, oxygen, carbon, nitrogen, other suitable material, or combinations thereof (for example, silicon oxide, silicon nitride, silicon oxynitride, or silicon carbide, low K (K<3.9) dielectric). In some examples, disposable spacer layer 222 include a multi-layer structure, such as a first dielectric layer that includes silicon nitride and a second dielectric layer that includes silicon oxide. In some embodiments, dielectric layer 220 and disposable spacer layer 222 include different compositions, such that an etching selectivity exists between dielectric layer 220 and disposable spacer layer 222 when both are subjected to a common etchant. Disposable spacer layer 222 may be formed by any suitable method, such as ALD, CVD, PVD, other suitable methods, or combinations thereof.

Still referring to FIGS. 1 and 4, at operation 108, method 100 forms a pattern layer 228 over device 200. In some embodiments, pattern layer 228 is formed conformally over device 200, that is, having about the same thickness on top surfaces and sidewalls of disposable spacer layer 222. Pattern layer 228 may include any suitable material, such as silicon nitride, silicon carboxynitride, other suitable dielectric materials, or combinations thereof. Pattern layer 228 is deposited by any suitable method, such as ALD, to any suitable thickness.

Figure 5:
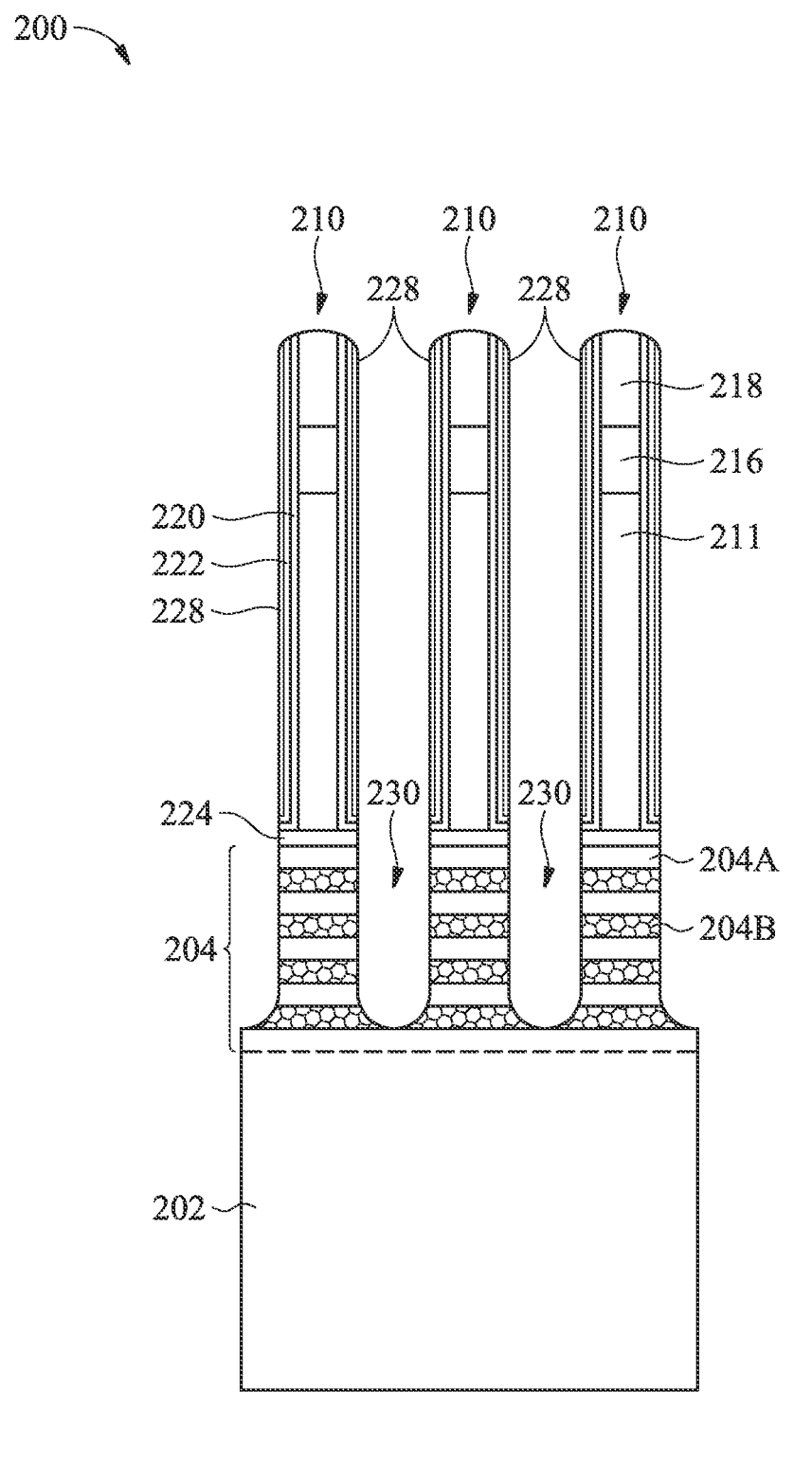

Now referring to FIGS. 1 and 5, at operation 110, method 100 removes portions of semiconductor fins 204 in the S/D regions to form trenches 230 therein. Therefore, sidewalls of alternating semiconductor layers 204A and 204B are exposed in trenches 230. In some embodiments, method 100 forms trenches 230 by a suitable etching process, such as a dry etching process, a wet etching process, a reactive ion etching (RIE) process, or combinations thereof. In some embodiments, method 100 selectively removes portions of semiconductor fins 204 to form trenches 230 along pattern layer 228 without etching or substantially etching portions of layers 220 and 222 formed on sidewalls of dummy gate stacks 210. In the depicted embodiment of FIG. 5, at operation 110, top portions of dielectric layer 220, disposable spacer layer 222 and pattern layer 228, as well as second hard mask layer 218 formed over dummy gate electrode 211 may also be removed to form trenches 230. The etching process at operation 110 may implement a dry etching process using an etchant including a bromine-containing gas (e.g., HBr and/or CHBR$_3$), a fluorine-containing gas (e.g., CF$_4$, SF$_6$, CH$_2$F$_2$, CHF$_3$, and/or C$_2$F$_6$), other suitable gases, or combinations thereof. The remaining portions of dielectric layer 220, disposable spacer layer 222 and pattern layer 228 along dummy gate stacks 210 form gate spacers.

Figure 6:
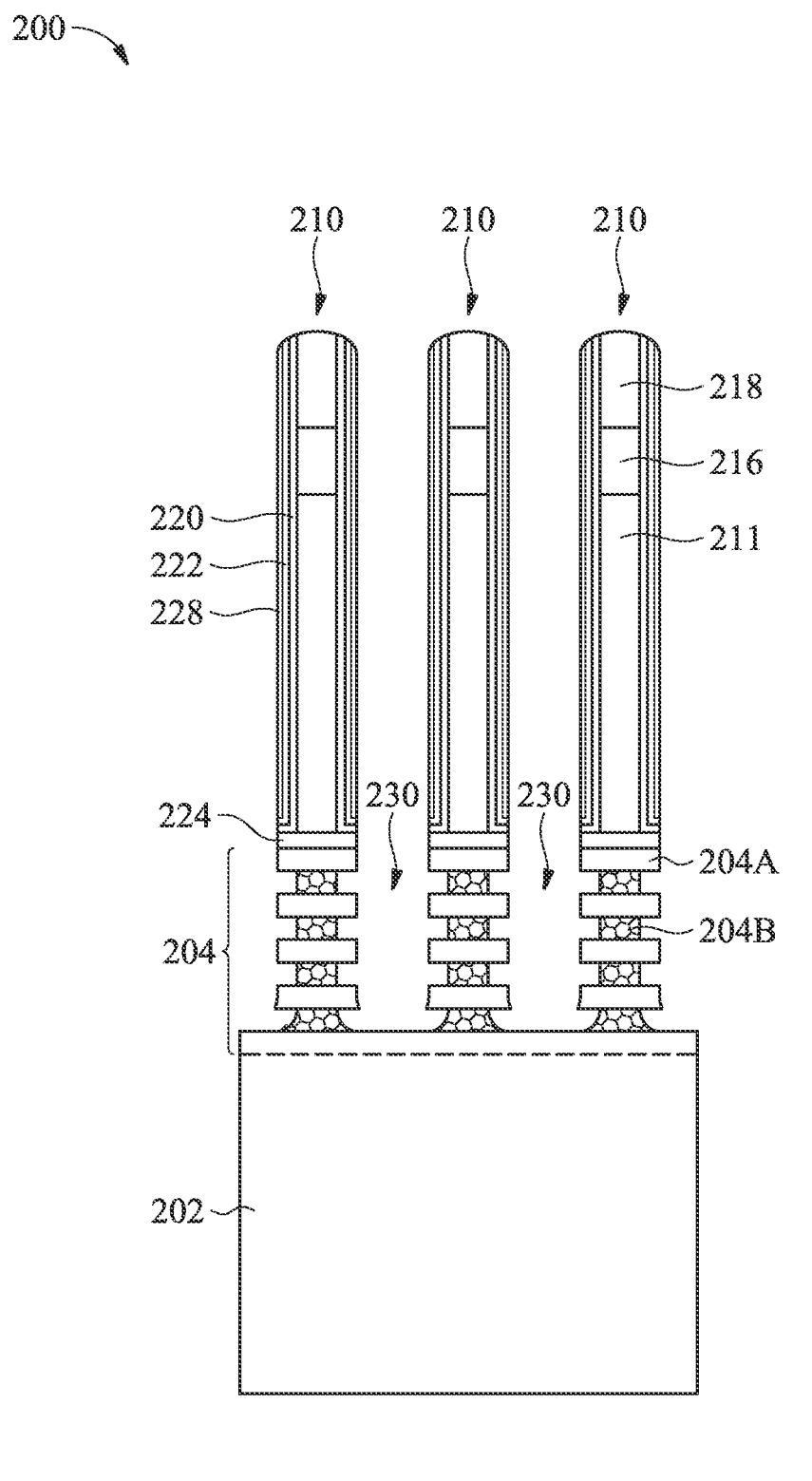

Now referring to FIGS. 1 and 6, at operation 112, method 100 selectively removes portions of semiconductor layers 204B exposed in trenches 230, by a suitable etching process to form recessed semiconductor layers 204B between semiconductor layers 204A, such that portions (edges) of semiconductor layers 204A are suspended in trenches 230. As discussed above, in the depicted embodiment, semiconductor layers 204A include Si and semiconductor layers 204B include SiGe. Accordingly, the etching process at operation 112 selectively removes portions of SiGe layers 204B without removing or substantially removing Si layers 204A. In some embodiments, the etching process is a selective isotropic etching process (e.g., a selective dry etching process or a selective wet etching process), and the extent of which a semiconductor material 204B is removed is controlled by duration of the etching process. In some embodiments, an extent of semiconductor layers 204B removed is about 3-8 nm. In some embodiments, the selective wet etching process may include a hydrogen fluoride (HF) or NH4OH etchant. In the depicted embodiment where semiconductor layers 204A comprise Si and semiconductor layers 204B comprise SiGe, the selective removal of the SiGe layers may include a SiGe oxidation process followed by a SiGeOx removal. For example, the SiGe oxidation process may include forming and patterning various masking layers such that the oxidation is controlled to the SiGe layers. In other embodiments, the SiGe oxidation process is a selective oxidation due to the different compositions of semiconductor layers 204A and 204B. In some embodiments, the SiGe oxidation process may be performed by exposing device 200 to a wet oxidation process, a dry oxidation process, or a combination thereof. Thereafter, the oxidized semiconductor layers, which include SiGeOx, are removed by an etchant such as NH4OH or diluted HF.

Figure 7:
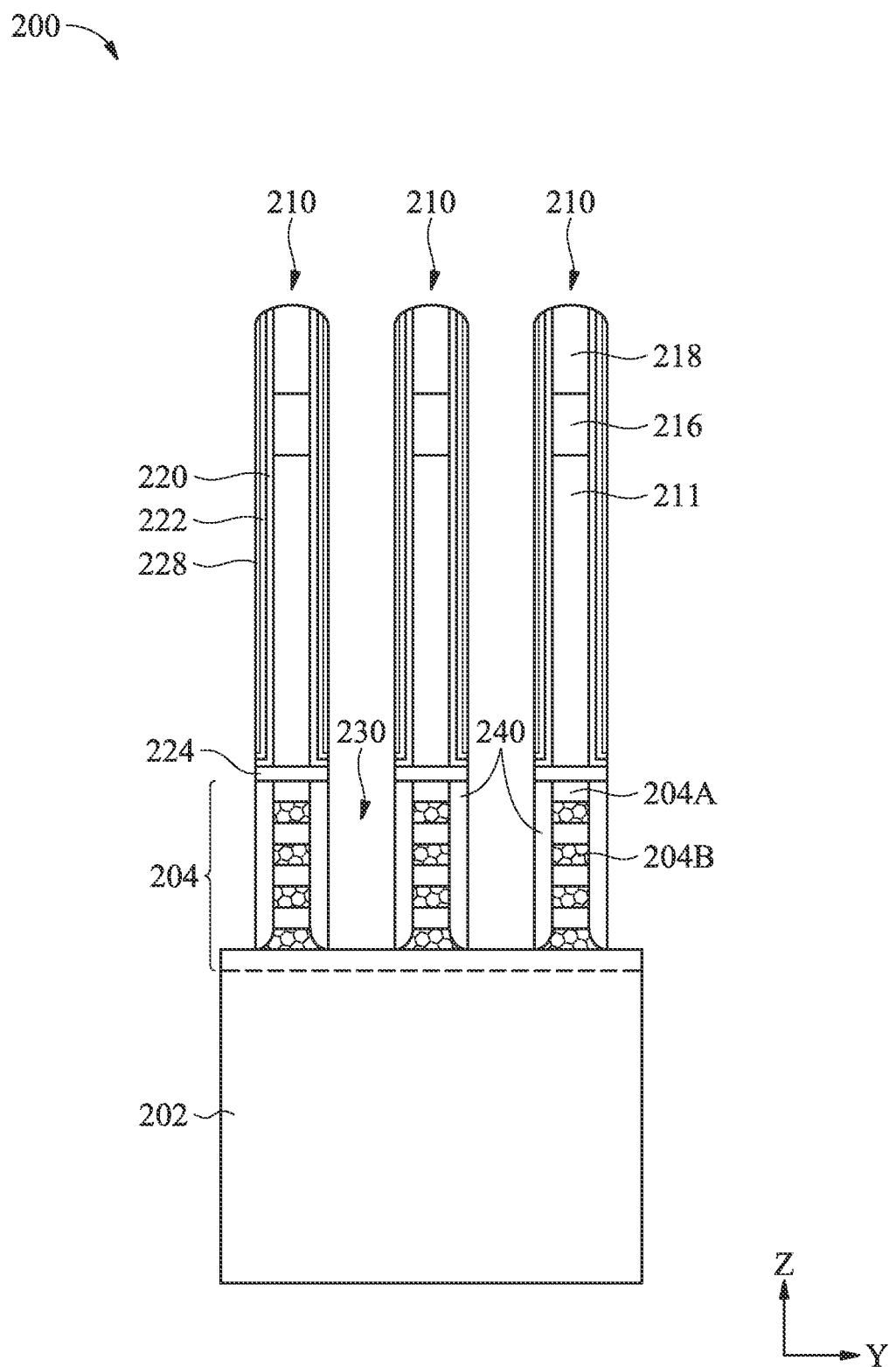

Now referring to FIGS. 1 and 7, at operation 114, method 100 forms self-aligned inner spacers 240 adjacent recessed semiconductor material 204B.

The present disclosure provides self-aligned inner spacers 240 that are formed by reflowing of semiconductor layers 204A to form a smooth or continuous sidewall surface of the S/D regions of device 200, that provides an optimized surface for epitaxially growing S/D features 250 (shown in FIG. 8) with reduced defects. Referring to FIGS. 1 and 7, at operation 114, method 100 reflows the suspended portions of semiconductor layers 204A to form self-aligned inner spacers 240. As depicted in FIG. 7, inner spacers 240 connect edge portions of the semiconductor layers 204A to the semiconductor layers 204A of the same type and enclose recessed semiconductor layers 204B. In some embodiments, as depicted in FIG. 7, sidewalls of the inner spacers 240 is straight from bottom to top, i.e. a width W1 (along Y-direction) of the top first semiconductor layer 204A between the inner spacers 240 is substantially equal to a width W2 (along Y-direction) of the bottom first semiconductor layer 204A between the inner spacers 240. In some other embodiments, the inner spacers 240 may have sidewalls tilted outward from bottom to top (facing away from substrate 202). In other words, a width W1 (along Y-direction) of the top first semiconductor layer 204A between the inner spacers 240 may be larger than a width W2 (along Y-direction) of the bottom first semiconductor layer 204A between the inner spacers 240. The reflow process may comprise various steps. In some embodiments, the reflow process include a high temperature baking process, thereby portions of semiconductor layers 204A reflows to fill the gap formed between edge portions of semiconductor layers 204A. In some embodiments, semiconductor layers 204A are heated to a suitable high temperature in a suitable ambient to mitigate the issues caused by unsuitable conditions. For example, if the processing temperature is too low, the formation of the inner spacers 240 may be incomplete; or if the processing temperature is too high, the growth rate of the inner spacers 240 is hard to be controlled and the dosages in the substrate 202 and/or spacers 204 may be affected. Thus, in some embodiments, the temperature is in a range between about 700 degrees Celsius and about 900 degrees Celsius, and the carrier gas includes hydrogen (H2), nitrogen (N2), ammonia (NH3), and/or combinations thereof. The baking process may last for a suitable period, for example, between about 30 and 60 seconds.

In a furtherance of the embodiments, in an event that a lower baking temperature is needed, a remote plasma may be introduced to help lowering the baking temperature and facilitate the reflow process. The parameters of the plasma treatment may be optimized according to the materials of the semiconductor layers and the ambient gas. In some embodiments, the reflow is processed in NH3 with H2 or N2 as carrier gas without plasma treatment. In some embodiment, NH3 is used as remote plasma with H2 or N2 as carrier gas. In some other embodiments, N2 is used as remote plasma with H2 or N2 as carrier gas. In some embodiments, a processing pressure is between about 5 torr and about 100 torr. In some embodiments where the carrier gas is H2, self-aligned inner spacers 240 formed after the reflow process include silicon (Si). In some other embodiments where the carrier gas is N2 or NH3, self-aligned inner spacers 240 formed after the reflow process include silicon nitride (SiN). Self-aligned inner spacers 240 formed by the reflow process form a smooth or continuous sidewall surface of the S/D regions of device 200 and thus provide a healthy environment for epitaxial S/D features to grow in the S/D regions.

Figure 8:
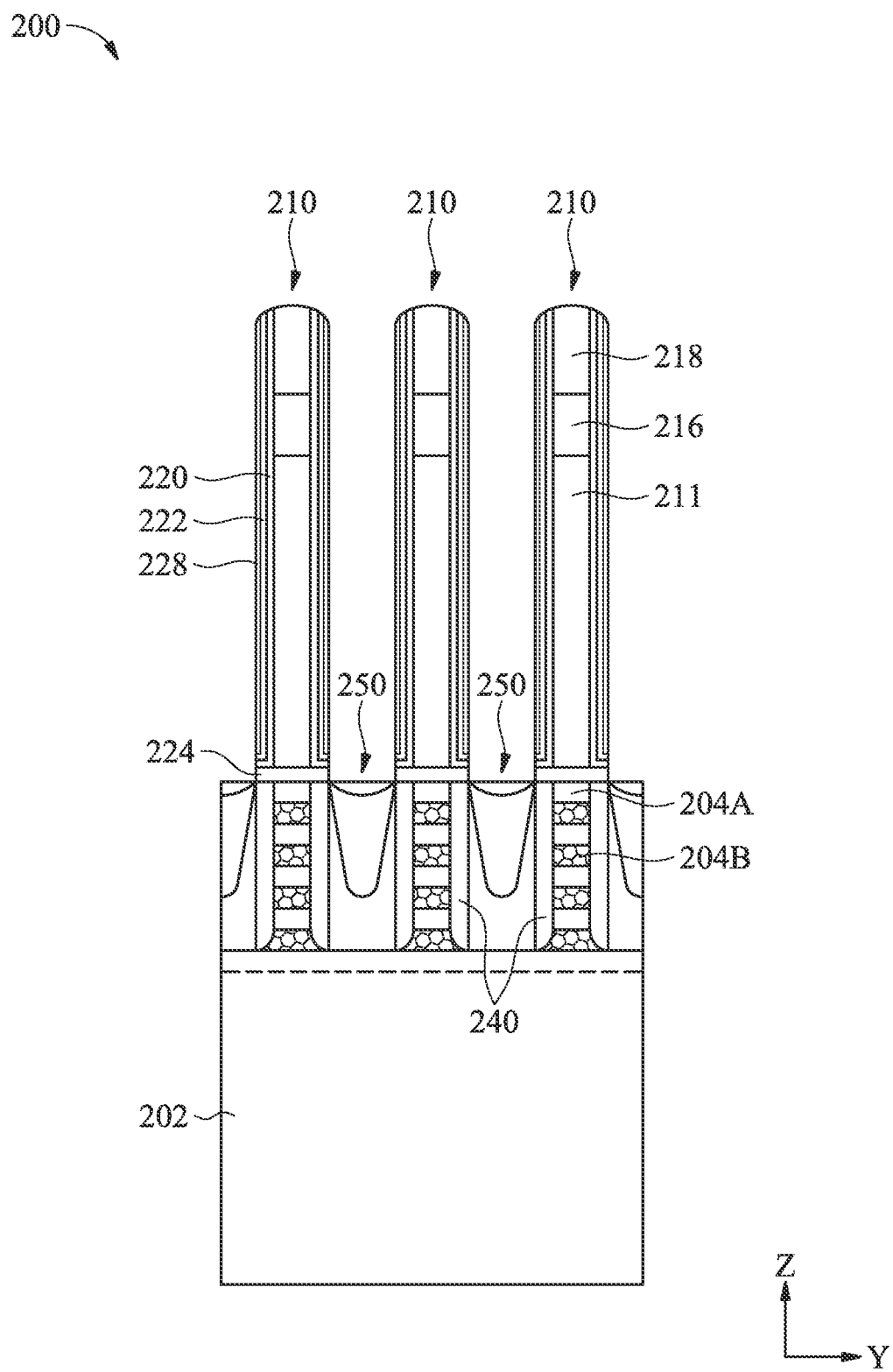

Referring to FIGS. 1 and 8, at operation 116, method 100 grows epitaxial S/D features 250 in recesses 230 in the S/D region of device 200. In some embodiments, epitaxial S/D features 250 include the same material as semiconductor layers 204A (for example, both include silicon). In some other embodiments, epitaxial S/D features 250 and semiconductor layers 204A include different materials or compositions. In various embodiments, epitaxial S/D features 250 may include a semiconductor material such as silicon or germanium; a compound semiconductor such as silicon germanium, silicon carbide, gallium arsenide, gallium phosphide, indium phosphide, indium arsenide, indium antimonide; an alloy semiconductor such GaAsP, AlInAs, AlGaAs, InGaAs, GaInP, and/or GaInAsP; or combinations thereof.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors. Epitaxial S/D features 250 may be doped with n-type dopants and/or p-type dopants. In some embodiments, epitaxial S/D features 250 are doped with boron, boron difluoride, carbon, other p-type dopant, or combinations thereof (for example, forming an Si:Ge:B epitaxial S/D feature or an Si:Ge:C epitaxial S/D feature). In some embodiments, epitaxial S/D features 250 are doped with phosphorous, arsenic, other n-type dopant, or combinations thereof (for example, forming an Si:P epitaxial S/D feature, an Si:C epitaxial S/D feature, or an Si:C:P epitaxial S/D feature). In some embodiments, epitaxial S/D features 250 may include multiple epitaxial semiconductor layers, and different epitaxial semiconductor layers are different in amount of dopant included therein. In some embodiments, epitaxial S/D features 250 include materials and/or dopants that achieve desired tensile stress and/or compressive stress in the channel regions. In some embodiments, epitaxial S/D features 250 are doped during deposition by adding impurities to a source material of the epitaxy process. In some embodiments, epitaxial S/D features 250 are doped by an ion implantation process subsequent to a deposition process. In some embodiments, annealing processes are performed to activate dopants in epitaxial S/D features 250 of semiconductor device 200, such as HDD regions and/or LDD regions.

Since the sidewall surfaces of S/D region of device 200 is continuous or smooth surface, merge defect of epitaxially grown of S/D features 250 are reduced. In a convention GAA device, first type semiconductor layers may include Si, second type semiconductor layers may include SiGe, and the inner spacers may include SiO2, SiOCN or SiN. The sidewall surface of the S/D region is non-smooth because it comprises sidewall surfaces of inner spacers (SiO2, SiOCN or SiN) and sidewall surfaces of the first type semiconductor layers (Si) exposed in the S/D region. Roughness of the S/D region surface may cause non-uniform epitaxial growth and merge defect of S/D features, which may further cause mobility reduction of the GAA device and thus degrade the GAA device's performance. The present disclosure provides device 200 comprising self-aligned inner spacers 240 formed by reflowing of semiconductor layers 204A. The sidewall surface of the S/D region formed by self-aligned inner spacers 240 are much smoother and continuous than that formed by the conventional inner spacers and first type semiconductor layers. Thus, epitaxial S/D features 250 in FIG. 8 have uniform profiles and there is no merge issue occurs.

Figure 9:
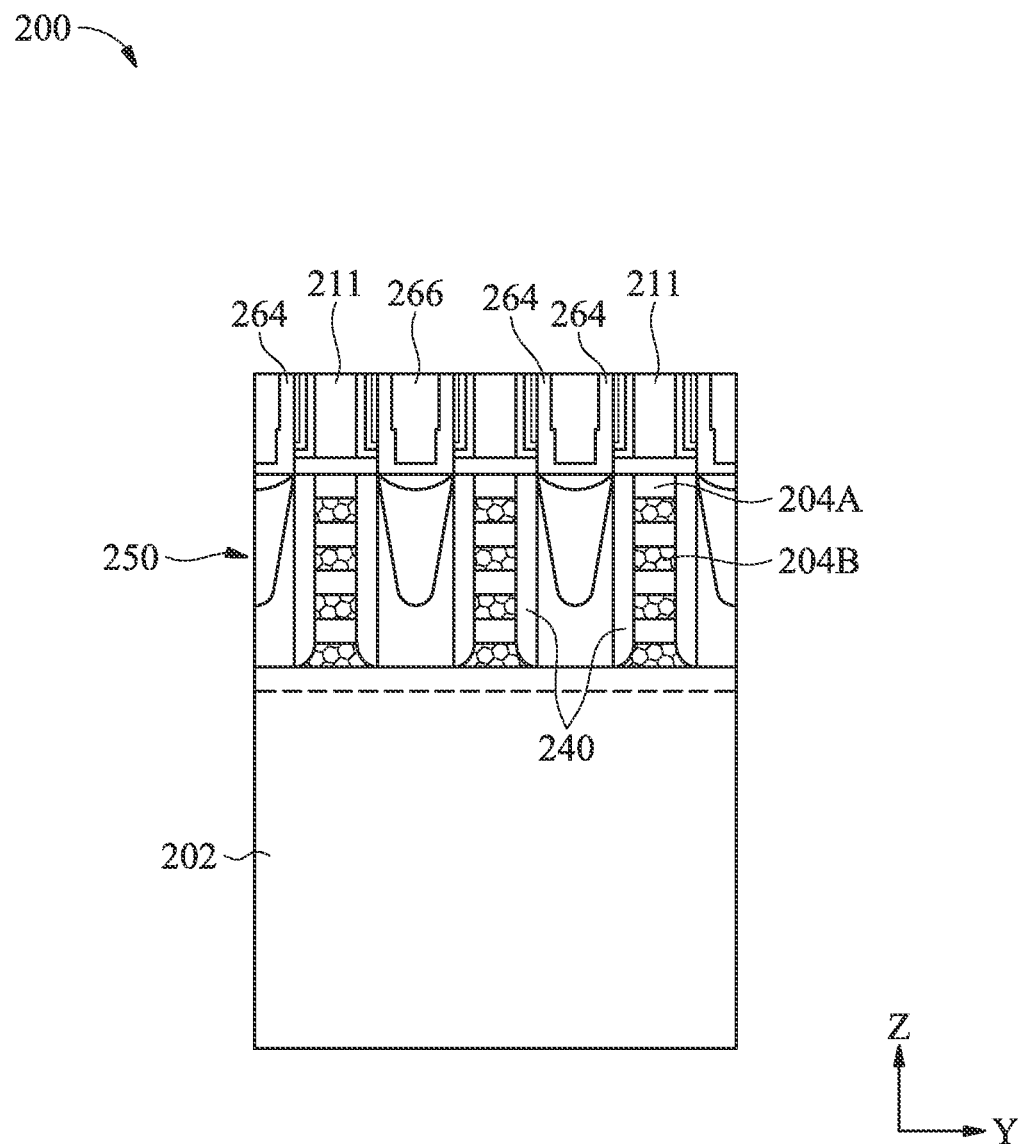

Referring to FIGS. 1 and 9, at operation 118, method 100 forms a contact etch stop (CES) layer 264 over device 200. CES layer 264 may include any suitable dielectric material, such as a low K dielectric material, and may be formed by any suitable method, such as ALD, CVD, PVD, other suitable methods, or combinations thereof. As illustrated in FIG. 9, CES layer 264 disposed along pattern layer 228 and covers epitaxial S/D features 250. In some embodiments, CES layer 264 may have a conformal profile on dummy gate stacks 210 (e.g., having about the same thickness on top and sidewall surfaces of dummy gate stacks 210).

Still referring to FIGS. 1 and 9, at operation 118, method 100 also deposits an interlayer dielectric (ILD) layer 266 over device 200. In some embodiments, ILD layer 266 is deposited over CES layer 264 by any suitable process. ILD layer 266 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. ILD layer 266 may include a multi-layer structure having multiple dielectric materials and may be formed by a deposition process such as CVD, flowable CVD (FCVD), spin-on-glass (SOG), other suitable methods, or combinations thereof. In some embodiments, operation 118 further includes performing a CMP process to planarize a top surface of device 200. The CMP process also removes first hard mask layer 216 and second hard mask layer 218. As a result, dummy gate electrode 211 (e.g., a poly layer) is exposed from a top surface of device 200.

Figure 10:
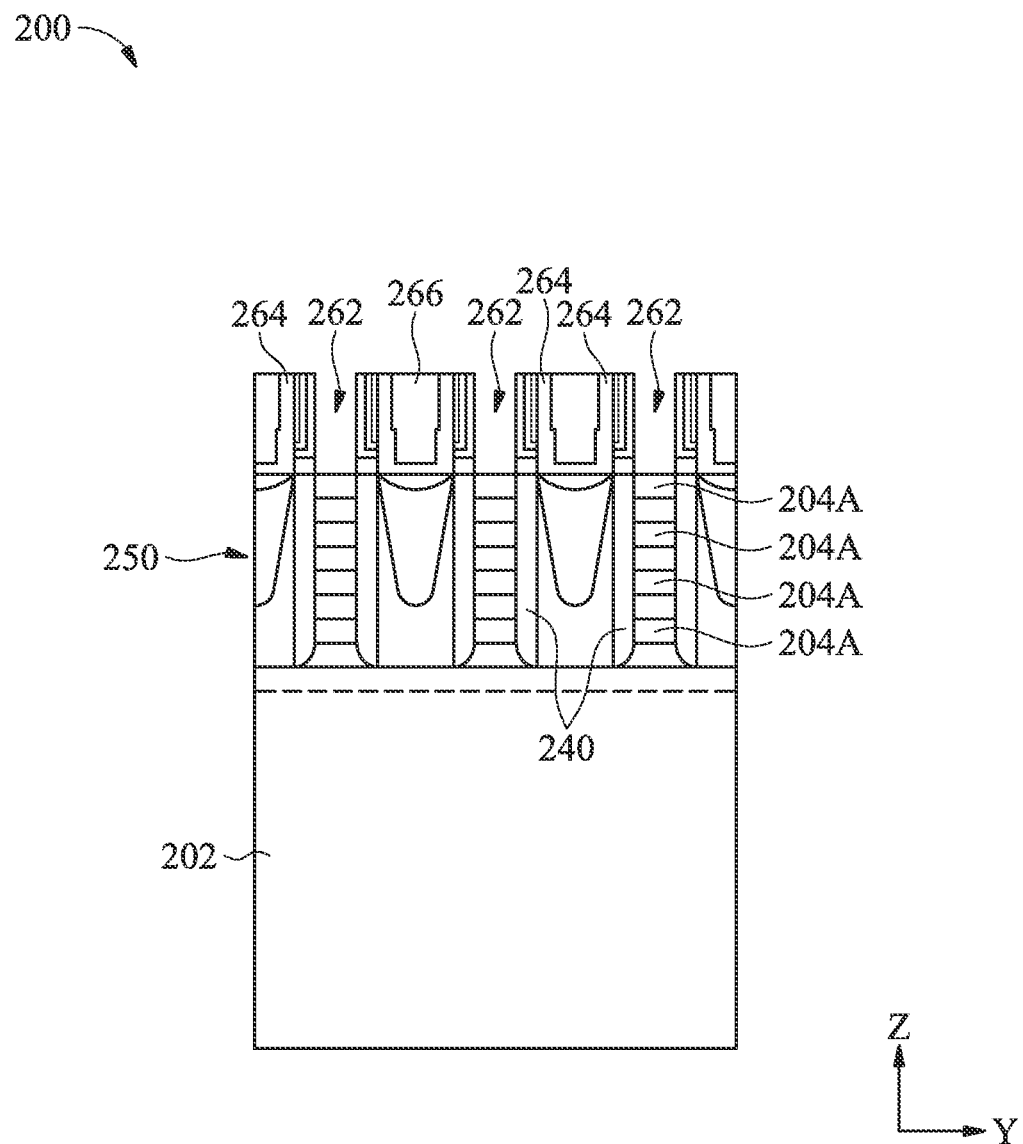
Figure 11:
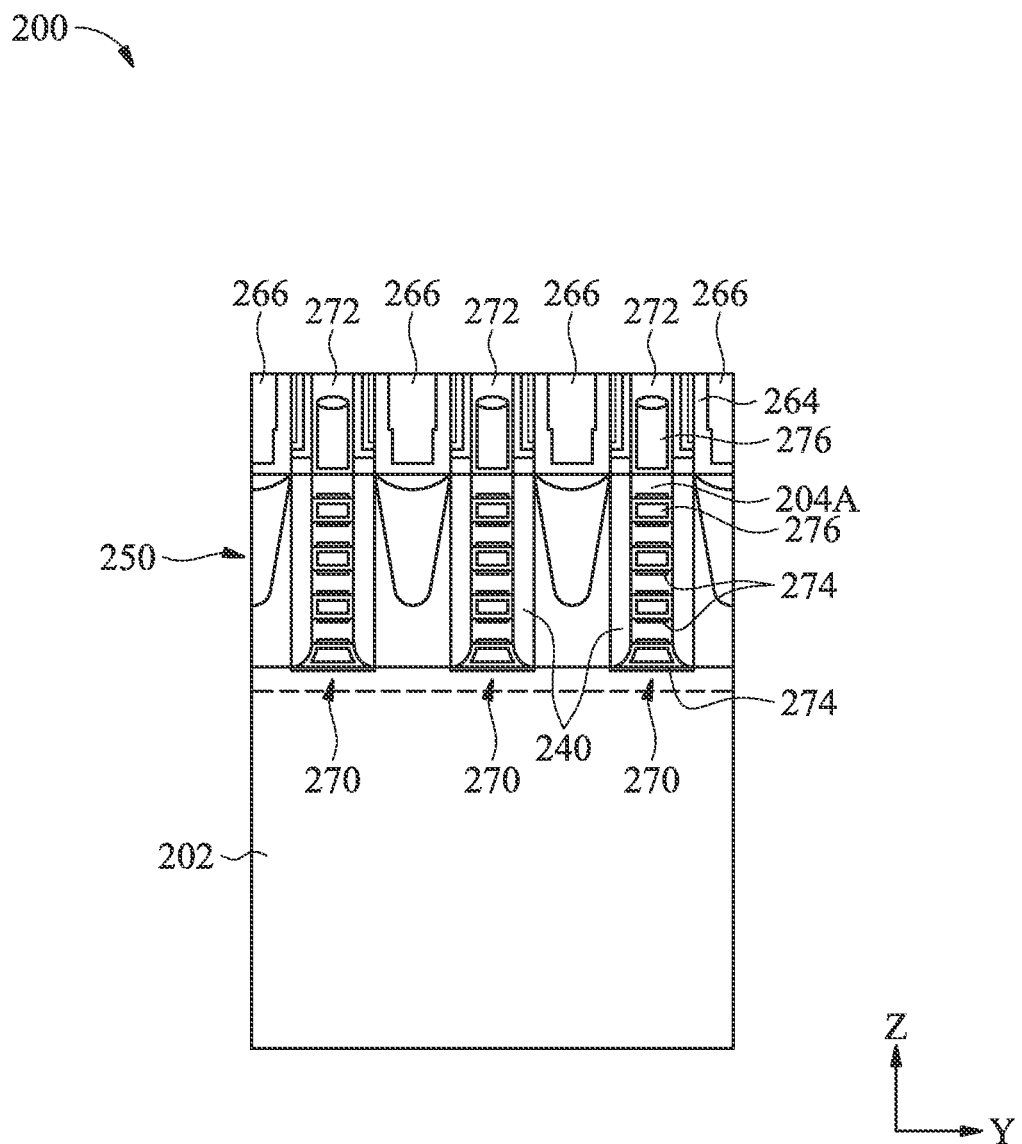

Referring to FIGS. 1, 10 and 11, at operation 120, method 100 performs a gate replacement process to replace dummy gate stacks 210 with respective metal gate structures 270. The gate replacement process at operation 120 may be implemented in a series of fabrication steps as described below.

Referring to FIGS. 1 and 10, at operation 120, method 100 removes dummy gate electrodes 211 to expose the channel regions of semiconductor fins 204. Dummy gate electrodes 211 are removed to form openings 262. The channel regions of semiconductor fins 204 are exposed in openings 262. In some embodiments, removing dummy gate electrode 211 includes one or more etching processes, such as wet etching, dry etching, RIE, other etching techniques, or combinations thereof.

Subsequently, method 100 removes semiconductor layers 204B, or portions thereof, through openings 262. As a result, semiconductor layers 204A in the channel region are suspended in openings 262. Semiconductor layers 204A are slightly etched or not etched depending on the design of device 200. For example, semiconductor layers 204A may be slightly etched to form wire-like shapes (for nanowire GAA transistors); semiconductor layers 204A may be slightly etched to form sheet-like shapes (for nanosheet GAA transistors); or, semiconductor layers 204A may be slightly etched to form other geometrical shapes (for other nanostructure GAA transistors). At operation 120, semiconductor layers 204B are removed by a selective etching process that is tuned to remove only semiconductor layers 204B while semiconductor layers 204A remain substantially unchanged. The selective etching of semiconductor layers 204B stops at self-aligned inner spacers 240 formed by reflowing of semiconductor layers 204A in the channel region. The selective etching may be a selective wet etching, a selective dry etching, or a combination thereof. In some embodiments, the selective wet etching process may include a hydrogen fluoride (HF) or NH4OH etchant. In the depicted embodiment where semiconductor layers 204B comprise SiGe and semiconductor layers 204A comprise Si, the selective removal of SiGe layers 204B may include a SiGe oxidation process followed by a SiGeOx removal. For example, the SiGe oxidation process may include forming and patterning various masking layers such that the oxidation is controlled to SiGe layers 204B. In some other embodiments, the SiGe oxidation process is a selective oxidation due to the different compositions of semiconductor layers 204A and 204B. In some embodiments, the SiGe oxidation process may be performed by exposing device 200 to a wet oxidation process, a dry oxidation process, or a combination thereof. Thereafter, the oxidized semiconductor layers 204B, which include SiGeOx, are removed by an etchant such as NH4OH or diluted HF.

Referring to FIGS. 1 and 11, still at operation 120, method 100 forms metal gate structures 270 over the channel region of semiconductor fins 204. Metal gate structures 270 fills openings 262 and wraps around each of semiconductor layers 204A enclosed by inner spacers 240 in the channel region of device 200. Each of metal gate structures 270 may include multiple layers, such as a gate dielectric layer 274 wrapping semiconductor layers 204A, and a gate electrode 276 including a work function metal layer formed over the gate dielectric layer, a bulk conductive layer formed over the work function metal layer, other suitable layers, or combinations thereof. In some embodiments, metal gate structures 270 are high-k metal gate structures (HKMG), where "high-k" indicates that each metal gate structure 270 includes a gate dielectric layer having a dielectric constant greater than that of silicon dioxide (about 3.9). The gate dielectric layer 274 may be a high-k layer and includes one or more high-k dielectric materials (or one or more layers of high-k dielectric materials), such as hafnium silicon oxide (HfSiO), hafnium oxide (HfO2), alumina (Al2O3), zirconium oxide (ZrO2), lanthanum oxide (La2O3), titanium oxide (TiO2), yttrium oxide (Y2O3), strontium titanate (SrTiO3), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. Metal gate structure 270 may include other material layers, such as a barrier layer, a glue layer, a hard mask layer 272 (shown in FIG. 11), and/or a capping layer. The various layers of metal gate structure 270 may be formed by any suitable method, such as CVD, ALD, PVD, plating, chemical oxidation, thermal oxidation, other suitable methods, or combinations thereof. Thereafter, method 100 may perform one or more polishing process (for example, CMP) to remove any excess conductive materials and planarize the top surface of device 200.

Figure 12:
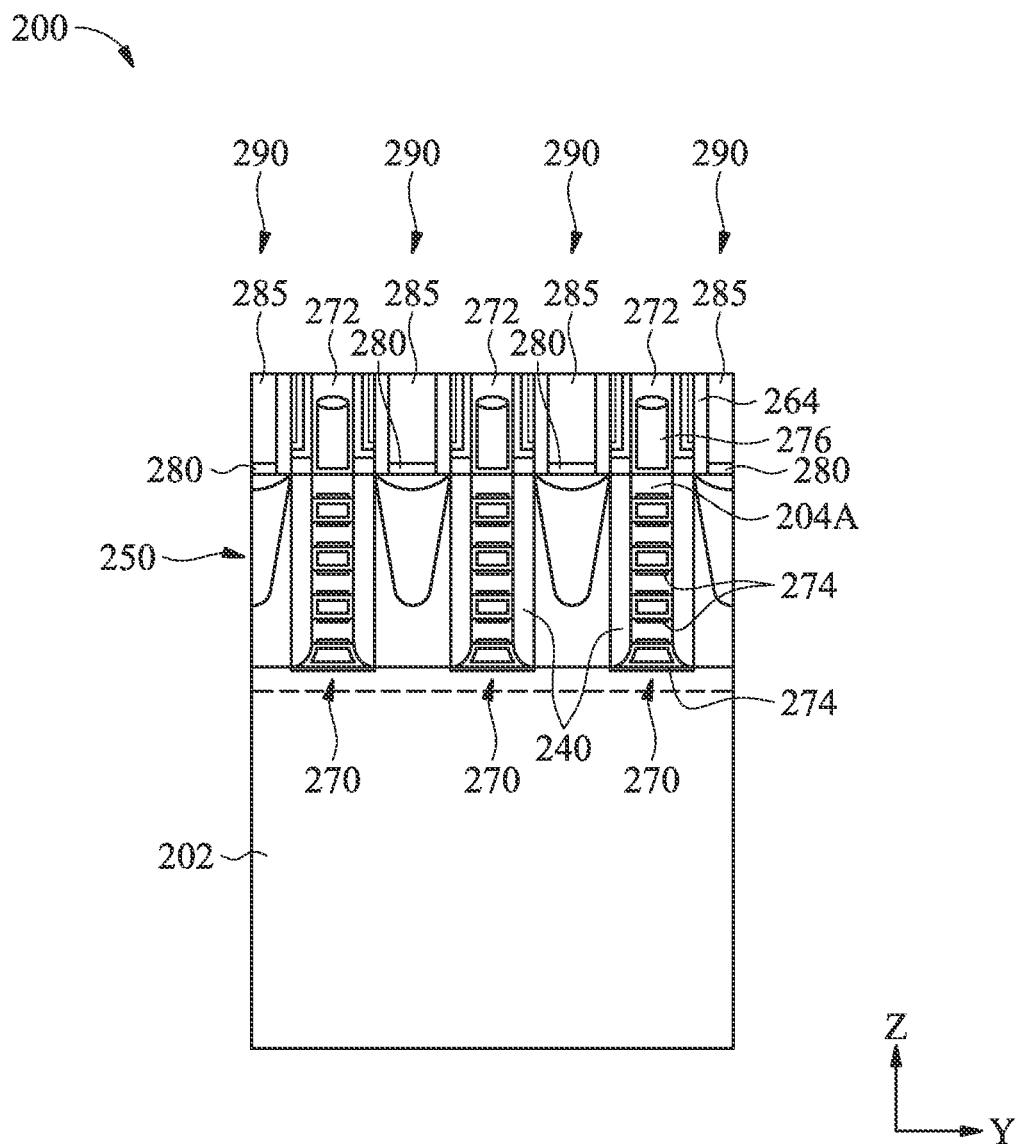

Referring to FIGS. 1 and 12, at operation 122, method 100 form S/D contacts 290 over epitaxial S/D features 250 in the S/D regions of device 200. As depicted in FIG. 12, each S/D contact 290 comprises a silicide layer 280 disposed over epitaxial S/D features 250 and a metal plug 285 disposed over silicide layer 280. Silicide layer 280 is optional for device 200 to further reduce the source/drain resistance. In some embodiments, S/D contacts 290 comprise single metal material. In some other embodiments, S/D contacts 290 comprise multiple metal layers. A material of S/D contacts 290 include any suitable electrically conductive material, such as Titanium (Ti), Titanium Nitride (TiN), Nickel (Ni), Molybdenum (Mo), Platinum (Pt), Cobalt (Co), Ruthenium (Ru), Tungsten (W), Tantalum Nitride (TaN), Copper (Cu), other suitable conductive materials, or combinations thereof. S/D contacts 290 are formed by any suitable processes, for example, lithography process, etch process, PVD, CVD, ALD, electroplating, electroless plating, other suitable deposition process, or combinations thereof. Any excess conductive material(s) can be removed by a planarization process, such as a CMP process, thereby planarizing a top surface of ILD layer 266 and S/D contacts 290.

At operation 124, method 100 performs further processing to complete the fabrication of device 200. For example, it may form various contacts, vias, wires, and multilayer interconnect features (e.g., metal layers and interlayer dielectrics) over substrate 202, configured to connect the various features to form a functional circuit that may include one or more GAA devices.

Although not intended to be limiting, one or more embodiments of the present disclosure provide many benefits to a semiconductor device and a formation process thereof. In some such examples, embodiments of the present disclosure form semiconductor device comprising self-aligned inner spacers. The self-aligned inner spacers form smooth or continuous surface of the S/D regions to provide a healthy grown environment for epitaxial growth of the S/D features. In addition, the self-aligned inner spacers are formed by reflowing the non-recessed semiconductor layers, thus the fabrication steps are reduced. The various steps of forming conventional inner spacers (for example, depositing of inner spacer layer, etching back, and etc.) are not needed and this results in fabrication cost reduction.

The present disclosure provides for many different embodiments. Semiconductor device having self-aligned inner spacers and methods of fabrication thereof are disclosed herein.

In one exemplary aspect, the present disclosure is directed to a method of forming a semiconductor device. The method comprises forming a fin over a substrate. The fin comprises a first semiconductor layer and a second semiconductor layer comprising different semiconductor materials, and the fin includes a channel region and a source/drain region. The method further comprises forming a dummy gate structure over the substrate and the fin and etching a portion of the fin in the source/drain region. The method further comprises selectively removing an edge portion of the second semiconductor layer in the channel region of the fin such that the second semiconductor layer is recessed, and an edge portion of the first semiconductor layer is suspended. The method further comprises performing a reflow process to the first semiconductor layer to form an inner spacer. The inner spacer forms sidewall surfaces of the source/drain region of the fin. The method further comprises epitaxially growing a sour/drain feature in the source/drain region.

In some embodiments, performing a reflow process to the first semiconductor layer comprises baking the first semiconductor layer to a temperature of about 700 degrees Celsius to about 900 degrees Celsius, with a carrier gas includes at least one of hydrogen (H2), nitrogen (N2), and ammonia (NH3), and for about 30 seconds to about 60 seconds. In some embodiments, the first semiconductor layer comprises silicon (Si) and the inner spacer comprises silicon (Si), and the carrier gas comprises hydrogen (H2). In some embodiments, the first semiconductor layer comprises silicon (Si) and the inner spacer comprises silicon nitride (SiN), and wherein the carrier gas comprises nitrogen (N2) or ammonia (NH3). In some embodiments, performing a reflow process to the first semiconductor layer comprises a remote plasma processing. And, the remote plasma processing utilizes a plasma source gas that includes at least one of ammonia (NH3) and nitrogen (N2). In some embodiments, the method further comprises selectively etching the second semiconductor layer in the channel region of the fin. The etching stops at the inner spacer. And, the method further comprises replacing the dummy gate structure with a metal gate structure.

In another exemplary aspect, the present disclosure is directed to a method of forming a semiconductor device. The method comprises forming a fin over a substrate. The fin comprises a first semiconductor layer and a second semiconductor layer comprising different semiconductor materials, and the fin comprises a channel region and a source/ drain region. The method further comprises forming a gate structure over the substrate and over the channel region of the fin. The method further comprises etching a portion of the first semiconductor layer and the second semiconductor layer in the source/drain region of the fin to form a trench therein. The method further comprises selectively removing a portion of the second semiconductor layer in the channel region of the fin; and reflowing the first semiconductor layer to form an inner spacer to connect the first semiconductor layer and the second semiconductor layer and form a sidewall surface of the trench. The method further comprises epitaxially growing a source/drain feature along the sidewall surface of the trench.

In some embodiments, reflowing the first semiconductor layer comprises baking the first semiconductor layer to a temperature of about 700 degrees Celsius to about 900 degrees Celsius with a carrier gas includes at least one of hydrogen (H2), nitrogen (N2), and ammonia (NH3). In some embodiments, reflowing the first semiconductor layer comprises a remote plasma process performed at a pressure of about 5 torr to about 100 torr. In some embodiments, the method further comprises selectively etching the second semiconductor layer in the channel region of the fin. The etching stops at the inner spacer. And, the method further comprises replacing the gate structure with a metal gate structure.

In yet another exemplary aspect, the present disclosure is directed to a semiconductor device. The semiconductor device comprises a fin disposed over a substrate. The fin comprises a channel region and a source/drain region, and the channel region of the fin comprises a plurality of first semiconductor layers separated from each other in a middle portion and connected by an inner spacer at an edge portion. The inner spacer forms a continuous surface of the source/drain region of the fin. The semiconductor device further comprises a gate structure disposed over the substrate. The gate structure wraps around the plurality of first semiconductor layers in the channel region of the fin. The semiconductor device further comprises a source/drain structure disposed in the source/drain region of the fin.

In some embodiments, the plurality of the first semiconductor layers comprises silicon (Si) and the inner spacer comprises silicon (Si). In some other embodiments, the plurality of the first semiconductor layers comprises silicon (Si) and the inner spacer comprises silicon nitride (SiN). In some embodiments, a sidewall of the inner spacer is tilted outwardly from bottom to top such that a width of a top first semiconductor layer between the inner spacer is larger than a width of a bottom first semiconductor layer between the inner spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin structure disposed over a substrate, the fin structure including:
   a plurality of semiconductor layers, wherein each semiconductor layer has a central portion and an outer portion, wherein the central portions of each semiconductor layer are spaced apart from each other; and
   an inner spacer formed of remnants of the plurality of semiconductor layers and extending between each semiconductor layer and interfacing with the outer portion of each semiconductor layer;
   a source/drain feature disposed on the fin structure adjacent the plurality of semiconductor layers, wherein the inner spacer is positioned between the source/drain feature and the plurality of semiconductor layers; and
   a gate dielectric layer including a first portion wrapping around a topmost semiconductor layer from the plurality of semiconductor layers and a second portion disposed directly on a top surface of the inner spacer, the top surface of the inner spacer facing way from the substrate.

2. The device of claim 1, wherein the first portion has a first thickness and the second portion has a second thickness that is greater than the first thickness.

3. The device of claim 1, further comprising a first dielectric spacer disposed along the first portion and over the second portion of the gate dielectric layer such that the dielectric spacer interfaces with both the first portion and the second portion of the gate dielectric layer.

4. The device of claim 3, further comprising a gate electrode layer wrapping around the first portion of the gate dielectric layer, and
   wherein the first portion of the gate dielectric layer interfaces with the gate electrode and the second portion of the gate dielectric layer does not interface with the gate electrode layer.

5. The device of claim 1, further comprising a second dielectric spacer disposed along an interfacing with the first dielectric spacer, and
   wherein the first dielectric spacer is positioned between the second dielectric spacer and the second portion of the gate dielectric layer such that the first dielectric spacer prevents the second dielectric spacer from interfacing with the second portion of the gate dielectric layer.

6. The device of claim 1, wherein the source/drain feature physically contacts the inner spacer and the inner spacer prevents the plurality of semiconductor layers from physically contacting the source/drain feature.

7. The device of claim 1, wherein the plurality of semiconductor layers are formed of the same material.

8. The device of claim 1, wherein the inner spacer is a silicon containing material layer.

9. A semiconductor device comprising:
   a fin disposed over a substrate, wherein the fin comprises a channel region and a source/drain region, the channel region of the fin comprises a plurality of first semiconductor layers separated from each other in a middle portion and connected by an inner spacer at an edge portion, the inner spacer forms a continuous surface of the source/drain region of the fin, wherein a topmost surface of the inner spacer layer is positioned at a first height above the substrate;
   a gate structure disposed over the substrate, wherein the gate structure wraps around the plurality of first semiconductor layers in the channel region of the fin, wherein the gate structure includes a gate electrode layer, wherein a topmost surface of the gate electrode layer is positioned at a second height above the substrate that is greater than the first height; and a source/drain structure disposed in the source/drain region of the fin.

10. The semiconductor device of claim 9, wherein the plurality of first semiconductor layers comprises silicon (Si) and the inner spacer comprises silicon (Si).

11. The semiconductor device of claim 9, wherein a sidewall of the inner spacer is tilted outwardly from bottom to top such that a width of a top first semiconductor layer between the inner spacer is larger than a width of a bottom first semiconductor layer between the inner spacer.

12. A device comprising:
a fin structure disposed over a substrate, the fin structure including:
   a plurality of semiconductor layers, wherein each semiconductor layer has a central portion and an outer portion, wherein the central portions of each semiconductor layer are spaced apart from each other; and
   an inner spacer formed of remnants of the plurality of semiconductor layers and extending between each semiconductor layer and interfacing with the outer portion of each semiconductor layer, wherein the inner spacer extends continuously from a bottommost semiconductor layer to a topmost semiconductor layer from the plurality of semiconductor layers;
a source/drain feature disposed on the fin structure adjacent the plurality of semiconductor layers, wherein the inner spacer is positioned between the source/drain feature and the plurality of semiconductor layers; and
a gate dielectric layer including a first portion wrapping around a topmost semiconductor layer from the plurality of semiconductor layers and a second portion disposed directly on a top surface of the inner spacer, the top surface of the inner spacer facing way from the substrate.

13. The device of claim 12, wherein the source/drain feature interfaces with the inner spacer.

14. The device of claim 12, wherein the plurality of semiconductor layers includes silicon.

15. The device of claim 12, wherein the first portion has a first thickness and the second portion has a second thickness that is greater than the first thickness.

16. The device of claim 12, wherein both the inner spacer and the plurality of semiconductor layers include silicon.

17. The device of claim 12, further comprising an etch stop layer interfacing with the second portion of the gate dielectric layer.

18. The device of claim 17, further comprising a silicide feature interfacing with the etch stop layer.

19. The device of claim 17, further comprising:
a first dielectric feature having a first L-shaped profile disposed on an interfacing with the second portion of the gate dielectric layer and the etch stop layer; and
a second dielectric feature having a second L-shaped profile disposed on an interfacing with the first dielectric feature and the etch stop layer.

20. The device of claim 9, wherein the topmost surface of the inner spacer faces away from the substrate, and
wherein the gate structure further includes a gate dielectric physically contacting the topmost surface of the inner spacer.

* * * * *